United States Patent
Yakovlev

(10) Patent No.: US 8,078,793 B1
(45) Date of Patent: Dec. 13, 2011

(54) METHOD, APPARATUS, AND COMPUTER-READABLE MEDIUM FOR STORING DATA ON A NON-VOLATILE MEMORY DEVICE

(75) Inventor: Sergiy B. Yakovlev, Duluth, GA (US)

(73) Assignee: American Megatrends, Inc., Norcross, GA (US)

( * ) Notice: Subject to any disclaimer, the term of this patent is extended or adjusted under 35 U.S.C. 154(b) by 711 days.

(21) Appl. No.: 11/414,642

(22) Filed: Apr. 27, 2006

(51) Int. Cl.
*G06F 12/00* (2006.01)

(52) U.S. Cl. ........ 711/103; 711/100; 711/144; 711/145; 711/156; 714/718; 714/723; 341/50; 341/65; 341/67

(58) Field of Classification Search ............. 365/185.29, 365/185.24, 185.02, 185.22; 341/50, 65, 341/67; 714/718, 723; 711/100, 103, 144, 711/145, 156
See application file for complete search history.

(56) References Cited

U.S. PATENT DOCUMENTS

| 5,777,923 | A | 7/1998 | Lee et al. |
| 5,913,215 | A | 6/1999 | Rubinstein et al. |
| 6,215,705 | B1 | 4/2001 | Al-Shamma |
| 6,794,997 | B2 * | 9/2004 | Sprouse ......................... 341/50 |
| 2002/0004878 | A1 | 1/2002 | Norman |
| 2005/0078519 | A1 * | 4/2005 | Shiga ...................... 365/185.17 |
| 2006/0245247 | A1 * | 11/2006 | Yano et al. ............... 365/185.08 |

* cited by examiner

*Primary Examiner* — Midys Rojas
(74) *Attorney, Agent, or Firm* — Hope Baldauff Hartman, LLC

(57) ABSTRACT

A non-volatile memory device stores configuration variables for use by a computer firmware. The variable is initially stored in the memory device in a manner that minimizes the number of bits used to store the variable that are in the updated state. When a request is received to change the initial value of the variable to an updated value, the value is changed in place by changing only the bits used to store the variable from an erased state to an updated state, by only setting the invert flag, by setting the invert flag and by changing one or more of the bits of the variable from the erased state to the updated state, or by storing the updated value of the variable in a new location in the memory device.

9 Claims, 6 Drawing Sheets

VARIABLE UPDATE THROUGH READ, MODIFY, AND WRITE TO NEW NVRAM LOCATION

INITIAL STORAGE OF VARIABLE

UPDATING VARIABLE BY CHANGING
INVERT FLAG ONLY

UPDATING VARIABLE BY CHANGING
ONLY BITS IN ERASED STATE

MULTIPLE-BIT INVERT FLAG

METHOD, APPARATUS, AND COMPUTER-READABLE MEDIUM FOR STORING DATA ON A NON-VOLATILE MEMORY DEVICE

TECHNICAL FIELD

The present invention is related to non-volatile memory devices. More particularly, the present invention is related to efficiently updating the contents of a non-volatile memory device.

BACKGROUND

PC-compatible computer systems have traditionally utilized a complementary metallic oxide semiconductor ("CMOS") memory device to store configuration information. Such a CMOS memory device is utilized by the computer's basic input/output system ("BIOS") to store configuration information for the computer, such as the date, time, and other configuration settings. The CMOS memory device is typically powered by a battery so that it retains the stored information when the computer is turned off.

Although CMOS devices have long been used in PC-compatible computers, these memory devices are falling out of favor as the preferred method for storing configuration information. One reason for this change is because CMOS memory devices must be powered by a battery when the computer is turned off. A drained or malfunctioning battery will cause the computer to lose its settings when power is removed. The battery and additional circuitry required by CMOS memory devices also adds additional cost to the computer. Moreover, CMOS memory devices tend to connect to the computer via a slow and outdated interface. For these reasons, and others, many PC-compatible computer systems are now utilizing a non-volatile random access memory ("NVRAM" or "flash") device to store configuration information and settings for the computer. NVRAM is a type of random access memory that retains its contents even when power is removed without the use of a battery.

Although NVRAM devices provide the benefit of being able to store computer configuration information even when power is removed, these devices are not without their drawbacks. These drawbacks typically involve the speed at which information can be stored on an NVRAM device. In particular, writing data to an NVRAM device can be time consuming. This is because bits within the device must be changed from an erased state to an updated state in order to write the data. Additionally, once the bits have been changed from the erased state to the updated state, the bits cannot be changed again without erasing the entire block of the NVRAM device that contains the bits. Erasing an entire block of an NVRAM is also a relatively time consuming operation. It is with respect to these considerations and others that the present invention has been made.

SUMMARY

In accordance with the present invention, a method, apparatus, and computer-readable medium for storing data on a non-volatile memory device are provided. According to one aspect of the invention, write operations directed to a non-volatile memory device are performed in a manner that reduces the number of data bits that must be changed from an erased state to an updated state, thereby improving the speed of non-volatile memory device write operations. Additionally, according to other aspects, the number of block erase operations that must be performed when storing data on a non-volatile memory device are reduced, which also speeds up write operations.

According to one aspect, a non-volatile memory device, such as an NVRAM, is utilized to store configuration variables for use by a computer firmware. The non-volatile memory device stores bits thereon in either an erased state or an updated state. Depending upon the actual device utilized, the erased state may be either zero or one. The updated state is the opposite of the erased state. Once bits have been changed from the erased state to the updated state, they cannot be changed again without erasing the block that contains the bits. The variables are stored in the memory device using one or more bits.

When a request is received to store a variable in the memory device, the variable is initially stored in the memory device in a manner that minimizes the number of bits used to store the variable that are in the updated state. This may be accomplished by selecting an initial value for the variable that includes the maximum number of bits that are in the erased state. Additionally, an invert flag may be utilized to maximize the number of bits of the variable that are in the erased state. The invert flag causes the read value of the variable to be inverted prior to being returned to the program requesting the value of the variable. In this manner, additional values for the variable may be utilized to maximize the number of bits in the erased state. For instance, if the erased state of the memory device is one and it is necessary to set the initial value of the variable to zero, the invert flag may be utilized to enable the initial value of the variable to be stored as all ones. Because the invert flag has been set, the value of the variable will be returned as zero even though it is stored as all ones in the memory device. The invert flag may be one or multiple bits. A multiple bit invert flag allows multiple inversions to be made by only changing a single bit from the erased state to the updated state.

When a request is received to change the initial value of the variable to an updated value, a determination is first made as to whether the value can be changed in place by changing only the bits used to store the variable from an erased state to an updated state. If this is possible, then the appropriate bits are changed, thereby avoiding a costly read-modify-write operation or block erase operation. If the value cannot be changed in place by only changing bits from an erased state to an updated state, a determination is then made as to whether the value can be changed by only setting the invert flag. If this is possible, then the value of the variable is updated by only setting the invert flag.

If the value cannot be changed in place by only setting the invert flag, then a determination is made as to whether the value can be changed in place by setting the invert flag and by changing one or more of the bits of the variable from the erased state to the updated state. If so, the variable is changed in place by setting the invert flag and by changing the appropriate bits from the erased state to the updated state. If the variable cannot be updated in place by setting the invert flag and changing bits from the erased state to the updated state, then the variable is updated by reading the value of the variable, updating the value of the variable to the new value, and saving the new value of the variable at a location in the memory device different from the location at which the variable was previously stored.

The above-described aspects of the invention may also be implemented as a computer-controlled apparatus, a computer process, a computing system, an apparatus, as an article of manufacture such as a computer program product or computer-readable medium, or as a semiconductor integrated circuit, including but not limited to a custom application specific integrated circuit, a programmable micro-controller type device, or a field-programmable gate array device. The computer program product may be a computer storage media readable by a computer system and encoding a computer program of instructions for executing a computer process. The computer program product may also be a propagated signal on a carrier readable by a computing system and encoding a computer program of instructions for executing a computer process.

These and various other features as well as advantages, which characterize the present invention, will be apparent from a reading of the following detailed description and a review of the associated drawings.

DETAILED DESCRIPTION

Figure 1:
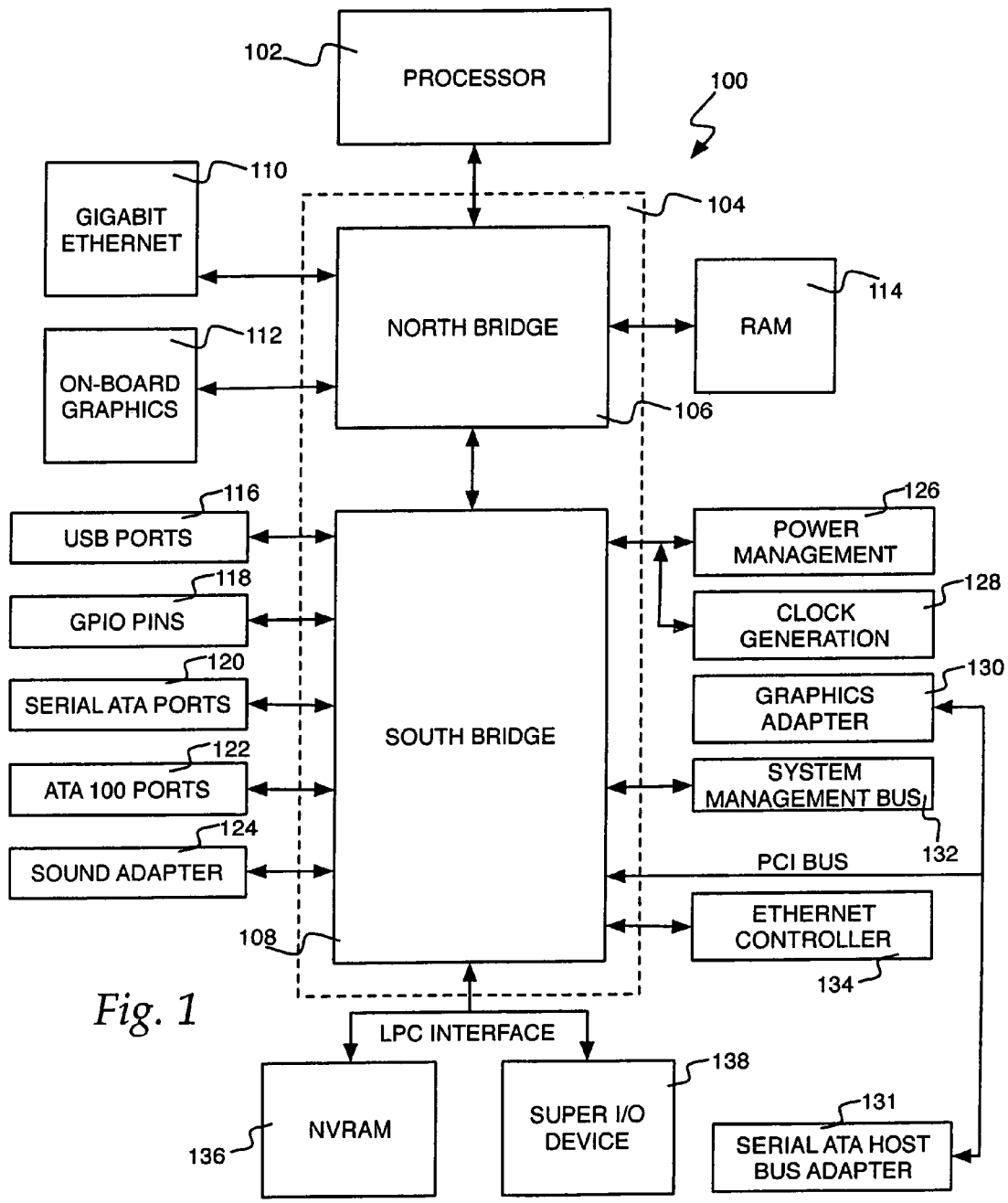
FIG. 1 is a computer architecture diagram showing aspects of a computer utilized as an illustrative operating environment for the various implementations described herein.

In the following detailed description, references are made to the accompanying drawings that form a part hereof, and in which are shown by way of illustration specific embodiments or examples. Referring now to the drawings, in which like numerals represent like elements through the several figures, aspects of the present invention and the exemplary operating environment will be described.

FIG. 1 and the following discussion are intended to provide a brief, general description of a suitable computing environment in which the invention may be implemented. Generally, program modules include routines, programs, components, data structures, and other types of structures that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote memory storage devices.

Referring now to FIG. 1, details regarding an illustrative operating environment for implementations of the invention will be provided. In particular, FIG. 1 illustrates a computer architecture for practicing the embodiments of the present invention. It should be appreciated, however, that although the embodiments of the invention described herein are discussed in the context of a conventional desktop or server computer, the embodiments of the invention may be utilized with virtually any type of computing device.

As described briefly above, the embodiments of the invention described herein provide methods, systems, apparatus, and computer-readable medium for storing data in a non-volatile memory device. FIG. 1 illustrates a computer that, as will be described in greater detail below, utilizes the implementations described herein to store data in a non-volatile memory. It should be appreciated that the architecture of the computer 100 is merely illustrative and that any type of computer may utilize the implementations described herein.

An illustrative computer architecture for practicing the various embodiments of the invention will now be described. In particular, the computer 100 includes a baseboard, or "motherboard", which is a printed circuit board to which a multitude of components or devices may be connected by way of a system bus or other electrical communication path. In one illustrative embodiment, a processor ("processor" or "CPU") 102 operates in conjunction with a chipset 104. The CPU 102 is a standard central processor that performs arithmetic and logical operations necessary for the operation of the computer 100.

The chipset 104 includes a north bridge 106 and a south bridge 108. The north bridge 106 provides an interface between the CPU 102 and the remainder of the computer 100. The north bridge 106 also provides an interface to the random access memory ("RAM") 114 and, possibly, an on-board graphics adapter 112. The north bridge 106 may also include functionality for providing networking functionality through a gigabit Ethernet adapter 110. The gigabit Ethernet adapter 110 is capable of connecting the computer 100 to another computer via a network. Connections which may be made by the network adapter 110 may include local area network ("LAN") or wide area network ("WAN") connections. LAN and WAN networking environments are commonplace in offices, enterprise-wide computer networks, intranets, and the Internet. The north bridge 106 is connected to the south bridge 108.

The south bridge 108 is responsible for controlling many of the input/output functions of the computer 100. In particular, the south bridge 108 may provide one or more universal serial bus ("USB") ports 116, a sound adapter 124, an Ethernet controller 134, and one or more general purpose input/output ("GPIO") pins 122. The south bridge 108 may also provide a system management bus 132 for use in managing the various components of the computer 100. Power management circuitry 126 and clock generation circuitry 128 may also be utilized during the operation of the south bridge 108. The south bridge 108 may also provide a bus for interfacing peripheral card devices such as a graphics adapter 130. In one embodiment, the bus comprises a peripheral component interconnect ("PCI") bus. The PCI bus may also be utilized to interface with one or more host bus adapters ("HBAs"), such as the serial ATA HBA 131.

According to embodiments, the south bridge 108 is an enhanced south bridge operative to provide a HBA for connecting mass storage devices to the computer 100 without the use of an add-in card such as the PCI HBA 131. For instance, according to an embodiment, the south bridge 108 includes a serial advanced technology attachment ("SATA") adapter for providing one or more serial SATA ports 120 and an ATA 100 adapter for providing one or more ATA 100 ports 122. The SATA ports 120 and the ATA 100 ports 122 may be, in turn, connected directly to one or more mass storage devices storing an operating system and application programs. As known to those skilled in the art, an operating system comprises a set of programs that control operations of a computer and allocation of resources. An application program is software that runs on top of the operating system software and uses computer resources made available through the operating system to perform application specific tasks desired by the user.

The mass storage devices connected to the south bridge 108, and its associated computer-readable media, provide non-volatile storage for the computer 100. Although the description of computer-readable media contained herein refers to a mass storage device, such as a hard disk or CD-ROM drive, it should be appreciated by those skilled in the art that computer-readable media can be any available media that can be accessed by the computer 100. By way of example, and not limitation, computer-readable media may comprise computer storage media and communication media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

A low pin count ("LPC") interface may also be provided by the south bridge 108 for connecting a "Super I/O" device 138. The Super I/O device 138 is responsible for providing a number of input/output ports, including a keyboard port, a mouse port, a serial interface, a parallel port, and other types of input/output ports. The LPC interface may also connect a non-volatile random access memory ("NVRAM") device 136 for storing a basic input/output system ("BIOS") 136 or an extensible firmware interface ("EFI") compatible firmware that includes program code containing the basic routines that help to start up the computer 100 and to transfer information between elements within the computer 100. It should be appreciated that the computer 100 may comprise other types of computing devices, including hand-held computers, embedded computer systems, personal digital assistants, and other types of computing devices known to those skilled in the art. It should be appreciated that the type of interface utilized to connect the NVRAM device 136 is dependent on the type of south bridge 108 that is utilized. The interface to the NVRAM device 136 may also comprise a firmware HUB, a Serial Peripheral Interface ("SPI"), as well as a LPC interface. It is also contemplated that the computer 100 may not include all of the components shown in FIG. 1, may include other components that are not explicitly shown in FIG. 1, or may utilize an architecture completely different than that shown in FIG. 1.

According to implementations, a portion of the NVRAM 136 is utilized by the BIOS or EFI firmware executing on the computer 100 to store configuration variables. The configuration variables comprise any type of data utilized by the BIOS or EFI firmware that must be retained even when power to the computer 100 is removed. The implementations described herein provide functionality for writing to and reading from the NVRAM 136 in a manner that provides increased speed. It should be appreciated that although the embodiments of the invention are described herein in conjunction with an NVRAM, any type of non-volatile memory device may be utilized. It should also be appreciated that the invention is not limited to the storage of configuration variables and that any type of data may be written to and read from a non-volatile memory device in the manner described herein.

As known to those skilled in the art, the contents of the NVRAM 136 must be block erased before data can be written to the device. By erasing the NVRAM 136, each of the data bits contained therein are set to an erased state. In some NVRAM devices the erased state is zero, while in other devices the erased state is one. When data is written to a portion of the NVRAM 136, the appropriate bits are changed from the erased state to an updated state. For a given device, the updated state is the inverse of the erased state. That is, if the erased state is zero then the updated state is one. If the erased state is one then the updated state is zero. The implementations of the invention described herein will operate equally well with NVRAM devices of either type.

Figure 2:
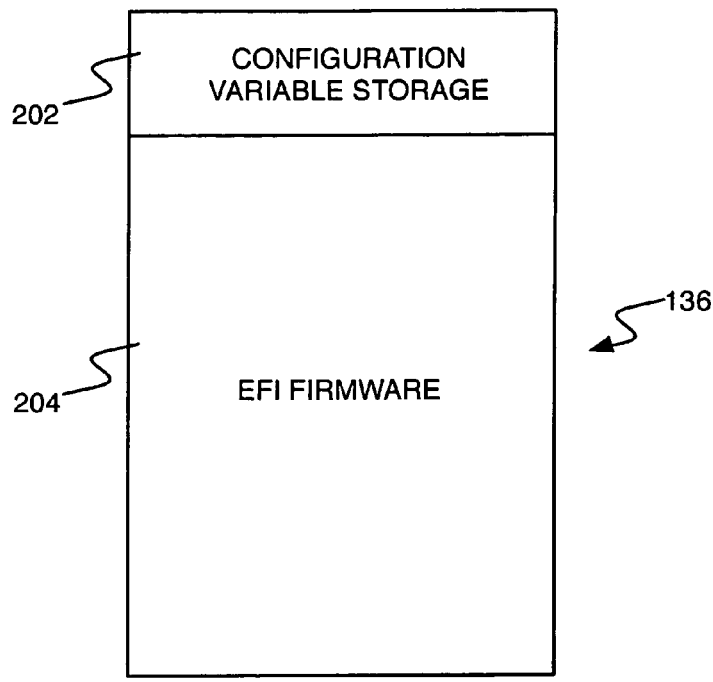
FIG. 2 is a block diagram showing aspects of a non-volatile memory device utilized in the implementations described herein.

Turning now to FIG. 2, additional details regarding the organization and structure of the contents of the NVRAM 136 will be described. As shown in FIG. 2, a portion of the NVRAM 136 is dedicated to storing the actual EFI firmware 204 or a BIOS. In turn, the EFI firmware 204, or BIOS, utilizes a portion of the NVRAM 136 to store its configuration variables 202. It should be appreciated that the NVRAM 136 may also include other data, including a protected boot block portion and other types of data. Additional details regarding the process utilized by the EFI firmware 204, or BIOS, to store its configuration variables 202 in the NVRAM 136 will be provided below with reference to FIGS. 3-9.

Figure 3:
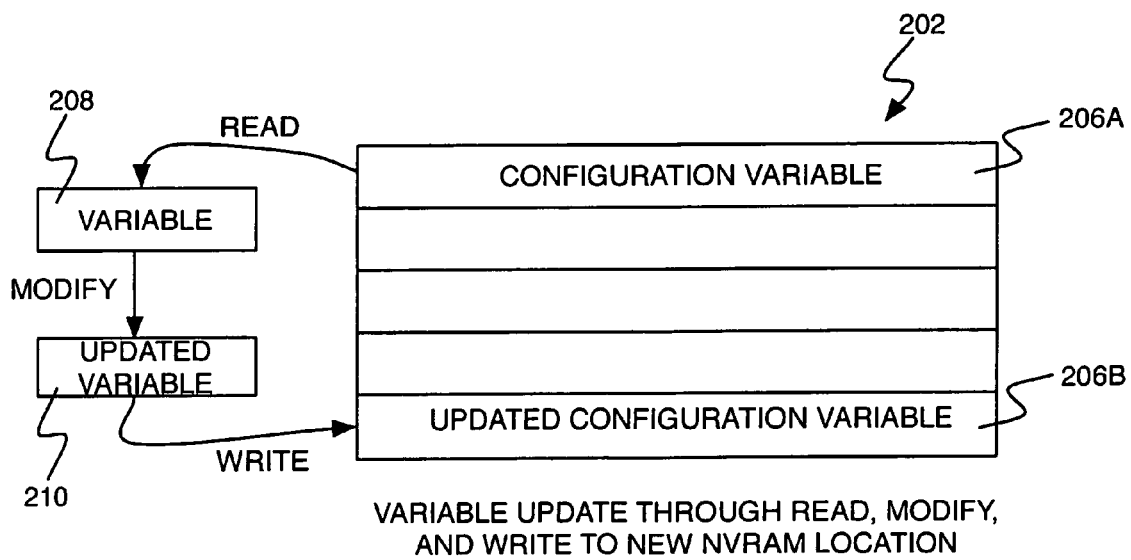
FIG. 3 is a block diagram showing aspects of a process for updating a variable stored in a non-volatile memory device by performing a read-modify-write operation.

Referring now to FIG. 3, one method utilized to store updated configuration variable data in the NVRAM 136 without performing an erase operation will be described. In particular, as shown in FIG. 3, configuration variable data 206A may be stored at a first location in the NVRAM 136. In order to update the variable data to an updated, or changed, value, the configuration variable data is first read into the main memory of the computer 100. The old variable value 208 is then modified to the updated variable value 210.

In order to store the updated variable value 210 on the NVRAM 136 without performing an erase operation, a new location is identified in the NVRAM 136 where all of the needed bits are in the erased state. The updated configuration variable data 206B is then stored at the new location. In this manner, a variable can be updated in the NVRAM 136 without the need for an erase operation. Additional details regarding the use of this process in the embodiments of the invention will be described below with respect to FIG. 8.

It should be appreciated that, according to one implementation, the configuration variable data 206A stored in NVRAM contains service information, such as a variable name and a GUID, along with an actual value for the variable. This service data includes a state flag that indicates whether the variable value is valid or not. When a variable gets changed and an updated instance of the variable data is created in a new location of the NVRAM, the state flag in old variable data instance is changed to reflect that this variable data instance is no longer valid.

Figure 4:
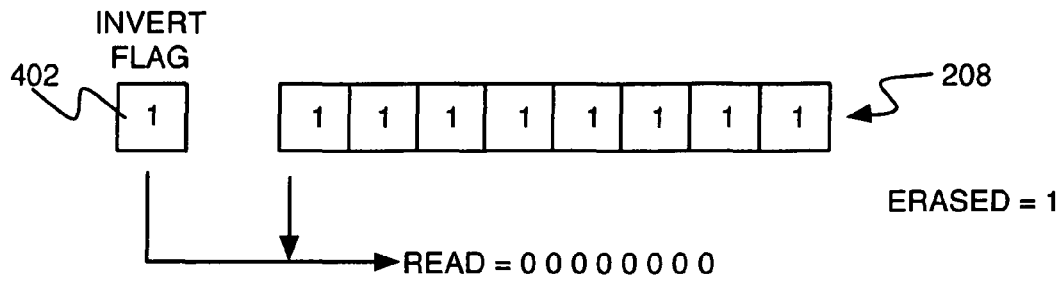
FIG. 4 is a block diagram showing aspects of an invert flag utilized in the implementations described herein.

Turning now to FIG. 4, aspects of the invention for initially storing a configuration variable in the NVRAM 136 will be described. As will be discussed in greater detail below, the initial value for a configuration variable may be selected and stored in the NVRAM 136 in a manner that minimizes the number of bits of the NVRAM 136 that must be changed from the erased state to the updated state in order to store the variable. In order to accomplish this, an invert flag 402 (also referred to as an "invert attribute") is associated with each configuration variable 208 and stored in the NVRAM 136. When set, the invert flag 402 causes the value of the configuration variable stored in the NVRAM 136 to be inverted during a read operation. When the invert flag 402 not set, the value of the configuration variable stored in the NVRAM 136 is returned normally. This allows significant flexibility in storing configuration variables in the NVRAM 136 in a manner that minimizes the number of bits of the NVRAM 136 that must be changed from the erased state to the updated state when storing or updating a variable.

In the example shown in FIG. 4, the value of the configuration variable to be stored in the NVRAM 136 is zero. The erased state of the NVRAM 136 is one and the invert flag is set and will cause an inverse value to be returned when its value is '1'. In order to store the value zero in the NVRAM 136 in a manner that minimizes the number of bits that must be changed from the erased state to the updated state, only the invert flag 402 is set. No other bits of the NVRAM 136 need be modified from the erased state to store the configuration variable. Therefore, even though each of the actual stored bits is a '1', because the invert flag 402 has been set, all '0s' will be returned when the value is read. The invert flag 402 may be set or not set in this manner depending upon which setting will require the fewest bits of the NVRAM 136 to be changed from the erased state to the updated state to store the configuration variable. Additional details regarding this process will be provided below.

Figure 5:
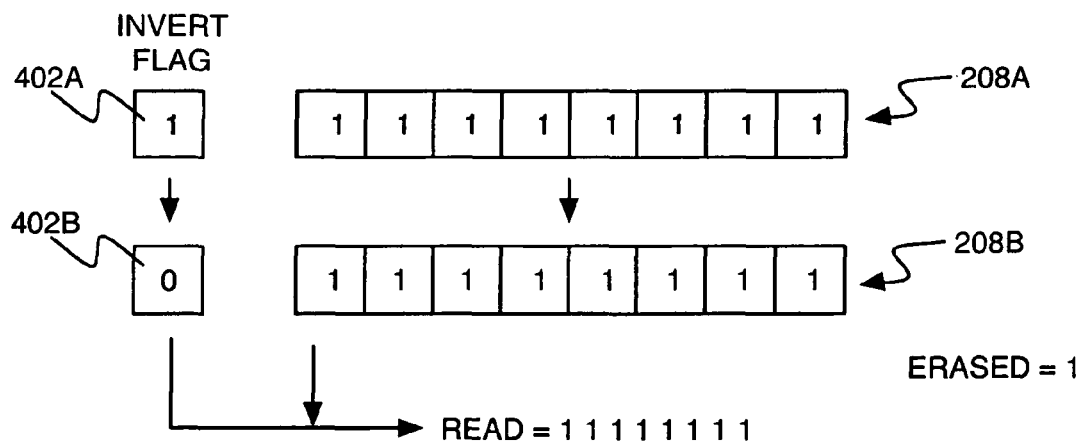
FIG. 5 is a block diagram illustrating aspects of a process provided herein for updating a variable stored in a non-volatile memory device by only setting an invert flag.

Referring now to FIG. 5, aspects of the invention for updating the value of a configuration variable stored in the NVRAM 136 by modifying only the value of the invert flag 402A will be described. In this example, the invert flag 402 is set when its value is '1'. As shown in FIG. 5, a value of '0' has been stored in the NVRAM 136 for an illustrative configuration variable 208A by leaving each of the bits in the variable and the invert flag in the erased state. Because the invert flag 402A is set, the contents of the NVRAM 136 will be inverted when read, thereby providing a read value of '0' for the configuration variable even though the stored bits are all '1'.

In order to update the value of the configuration variable 208A to the value of '255', it is only necessary to change the one bit of the invert flag 402A. Changing the value of the invert flag 204A from '1' to '0' causes the data stored for the configuration variable not to be inverted when read. Because the invert flag 402B has been reset, the actual bits '1111111', or '255' in decimal, will be returned. It should be appreciated that the values of '0' and '255' are merely illustrative and that any bit pattern may be utilized in a similar manner.

Figure 6:
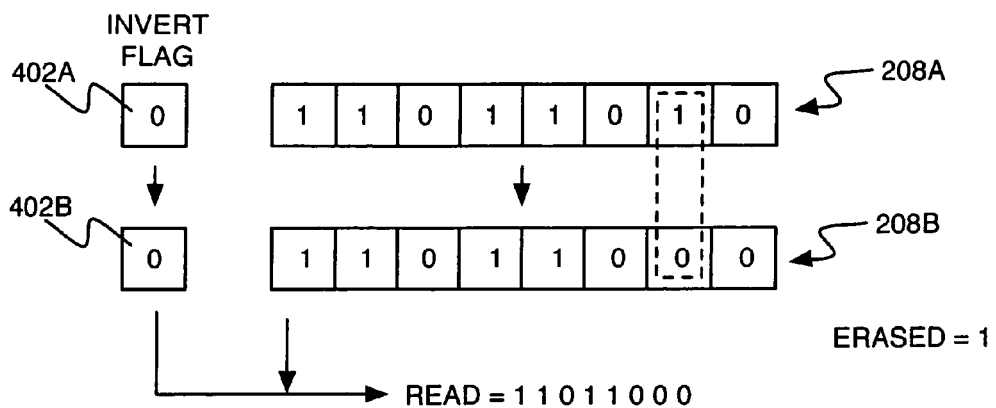
FIG. 6 is a block diagram illustrating aspects of a process provided herein for updating a variable stored in a non-volatile memory device by only changing bits from an erased state to an updated state.

Turning now to FIG. 6, aspects of the invention for updating the value of a configuration variable stored in the NVRAM 136 by only changing bits from the erased state to the updated state will be described. As shown in FIG. 6, the value of a configuration variable 208A can be updated to a new value by only changing bits of the configuration variable that are stored in the NVRAM 136 in an erased state. For instance, the seventh bit of the configuration variable 208A is set as a '1', which is the erased state for the NVRAM 136 in this example. In order to update the value of the configuration variable 208A to a new value, the '1' of the seventh bit is changed to a zero. The configuration variable 208B is the result. Because the bit is being modified from the erased state to the updated state, no erase operation is required. It should be appreciated that any bit, or bits, of the configuration variable may be changed from the erased state to the updated state to create an updated value without performing an erase operation or a costly read-modify-write operation.

Figure 7:
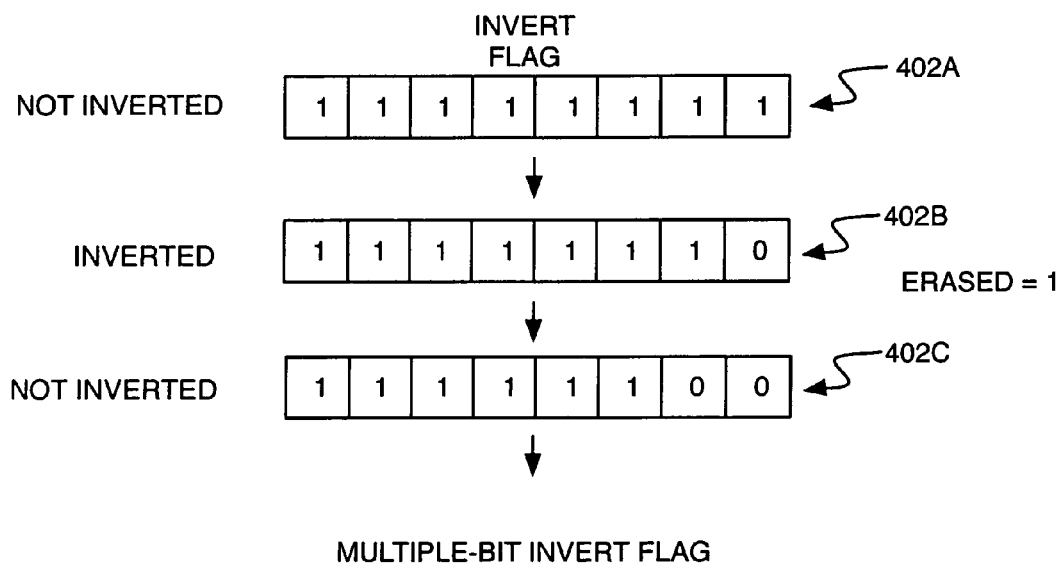
FIG. 7 is a block diagram showing aspects of a multiple bit invert flag utilized in the implementations described herein.

Referring now to FIG. 7, additional aspects of the invert flag 402 will be described. As shown in FIG. 7, the invert flag 402 may comprise more than one bit according to embodiments of the invention. In the example shown in FIG. 7, eight bits are used for the invert flag 402. It should be appreciated, however, that any number of bits may be utilized. By utilizing additional bits for the invert flag 402, a greater number of possibilities for setting the configuration variable using the fewest number of bits in the updated state are made possible. This is because each bit of the multiple-bit inverse flag may be used to signal that the read value of the configuration variable should be inverted, or not inverted.

An example use of a multiple-bit invert flag 402 is shown in FIG. 7. In particular, the value of the invert flag 402A is all ones, which is the erased state of the NVRAM 136 in this example. This value of the invert flag 402A indicates that the value of the associated configuration variable should not be inverted when read. When the eighth bit of the invert flag is changed to zero, as shown by the invert flag 402B, this indicates that the value of the configuration variable stored in the NVRAM 136 should be inverted when returned.

In order to cause the value of the variable to again be returned normally, the seventh bit of the invert flag may be changed from the erased state to the updated state. This results in the value of the read configuration variable to be returned normally. It should be appreciated that each bit of the multiple-bit invert flag may be utilized to change the way that the configuration variable is returned. It should be appreciated that this is accomplished by only changing bits of the multiple-bit invert flag 402 from the erased state to the updated state. This provides a great amount of flexibility in how the actual bits of the configuration variable are stored in the NVRAM 136 to minimize the number of bits in the updated state.

Figure 8:
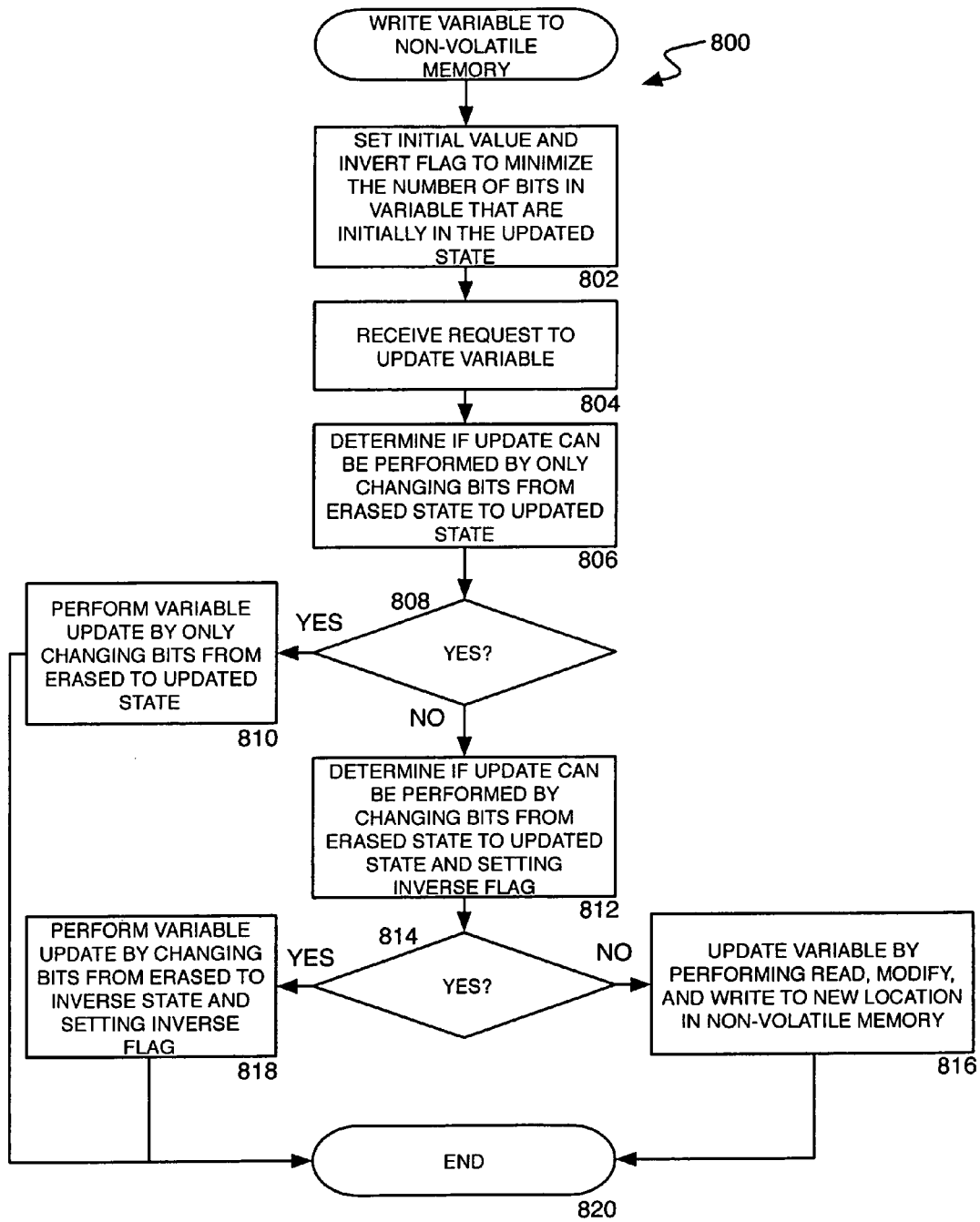
FIG. 8 is a flow diagram illustrating aspects of a process provided herein for writing a variable to a non-volatile memory device.

Referring now to FIG. 8, additional details regarding a process for writing data to a non-volatile memory device will be provided. In particular, a routine 800 will be described illustrating operations performed by the computer 100 for writing data to the NVRAM 136. It should be appreciated that the logical operations of the various embodiments of the present invention are implemented (1) as a sequence of computer implemented acts or program modules running on a computing system and/or (2) as interconnected machine logic circuits or circuit modules within the computing system. The implementation is a matter of choice dependent on the performance requirements of the computing system implementing the invention. Accordingly, the logical operations of FIGS. 8 and 9, and others making up the embodiments of the present invention described herein, are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

The routine 800 begins at operation 802, where the initial value of the configuration variable and its associated invert flag are set in a manner that minimizes the number of bits that must be changed from the erased state to the updated state to store the variable. The process for storing the configuration variable and its invert flag in the NVRAM 136 in a manner that minimizes the number of bits in the updated state is discussed above with respect to FIG. 4.

Once the configuration variable and its invert flag have been stored in the NVRAM 136, the variable may be read into the computer 100, which is described below with respect to FIG. 9. The value of the configuration variable may also be updated. The process of updating the value of the configuration variable begins at operation 804, where a request to update the value of the configuration variable is received. In response to the request, the routine 800 continues to operation 806, where a determination is made as to whether the value of the variable can be updated at its current location in the NVRAM 136 by only changing bits of the configuration variable from an erased state to an updated state. If so, the routine 800 branches from operation 808 to operation 810, where the value of the configuration variable is updated to the new value at its current location in the NVRAM 136 by only changing bits of the configuration variable from the erased state to the updated state. A process for updating a configuration variable by changing only bits from the erased state to the updated state was discussed above with respect to FIG. 6. Once the update has been performed, the routine 800 continues from operation 810 to operation 820, where it ends.

If, at decision operation 806, it is determined that the configuration variable cannot be updated at its location in the NVRAM 136 by changing only bits from the erased state to the updated state, the routine 800 continues from operation 808 to operation 812. At operation 812, a determination is made as to whether the value of the configuration variable can be updated at its location in the NVRAM 136 by setting or resetting the invert flag and by changing zero or more of the bits of the configuration variable from the erased state to the updated state. If so, the routine 800 branches from operation 814 to operation 818, where the value of the configuration variable is updated at its current location in the NVRAM 136 by setting or resetting the invert flag and by changing zero or more of the bits of the configuration variable from the erased state to the updated state. This process is described above with reference to FIGS. 5 and 6. Once the update has been completed, the routine 800 continues to operation 820, where it ends.

If, at decision operation 812, it is determined that the value of the configuration variable cannot be updated in place by setting or resetting the invert flag and by changing zero or more of the bits of the configuration variable from the erased state to the updated state, then the routine 800 branches from operation 814 to operation 816. At operation 816, the value of the configuration variable is updated by reading the old value of the configuration variable from the NVRAM 136, modifying the old value to the new updated value, and writing the updated value to a new location within the NVRAM 136. This process is illustrated and described above with respect to FIG. 3. It should be appreciated that the updated value may be stored in the new location in the manner described above with respect to block 802. Moreover, the updated value may be stored by modifying the data at the new location in the manner described above with respect to blocks 806 and 812. Once the update has been completed, the routine 800 continues from operation 816 to operation 820, where it ends.

Figure 9:
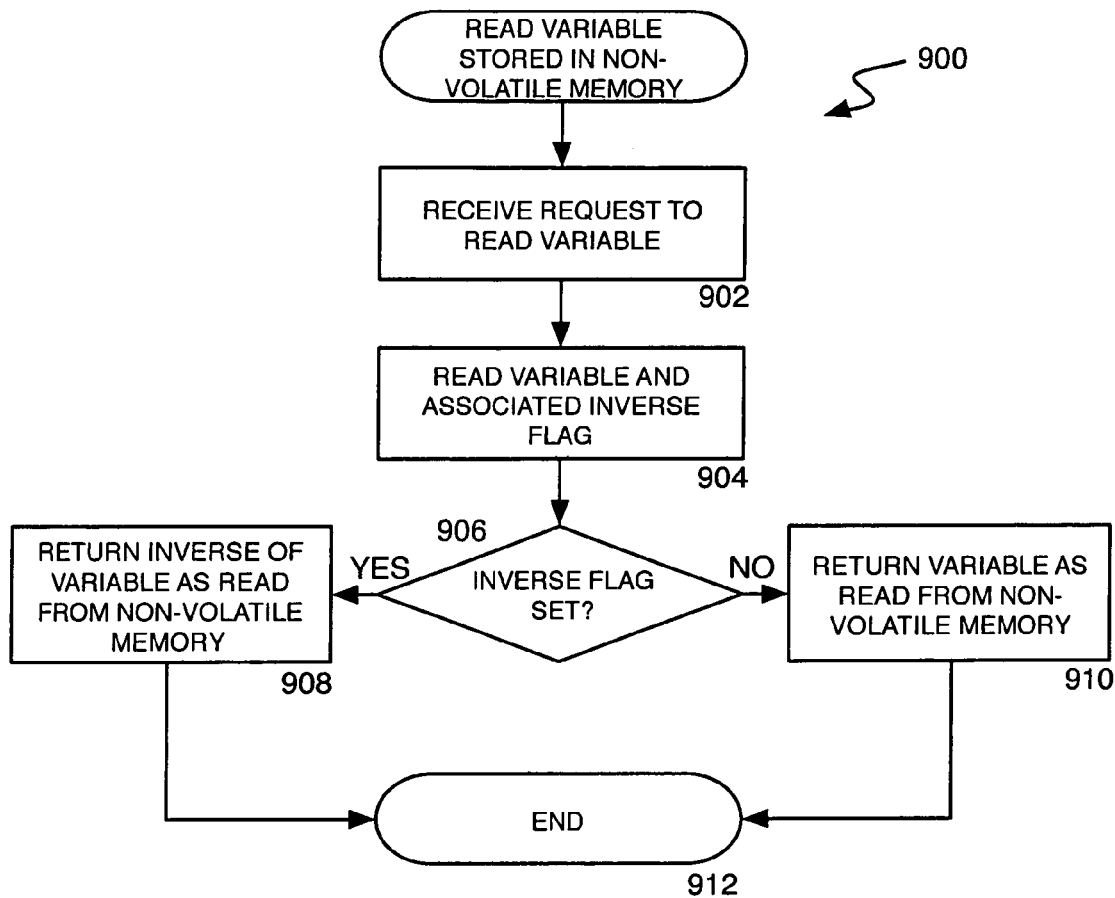
FIG. 9 is a flow diagram illustrating aspects of a process provided herein for reading a variable from a non-volatile memory device.

Referring now to FIG. 9, a routine 900 will be described for reading data from a non-volatile memory device that has been written in the manner described above with respect to FIG. 8. As discussed above, the EFI firmware 204, or other program executing on the computer 100 responsible for reading configuration variables from the NVRAM 136 are operative to utilize the setting of the invert flag to return the correct value. The routine 900 illustrates this process.

The routine 900 begins at operation 902 where a request is received to read a configuration variable from the NVRAM 136. In response to the request, the routine 900 continues to operation 904, where the requested configuration variable and its associated invert flag 402 are read from the NVRAM 136. The routine 900 then continues to operation 906, where a determination is made as to whether the invert flag for the variable is set in a manner that requires the value of the variable read from the NVRAM 136 to be inverted. If so, the routine 900 branches to operation 908, where the inverse of the variable as read from the NVRAM 136 is returned in response to the request. If not, the routine 900 branches to operation 910, where the actual data as read from the NVRAM 136 is returned in response to the request. From operations 908 and 910, the routine 900 continues to operation 912, where it ends.

It will be appreciated that embodiments of the present invention provide methods, systems, apparatus, and computer-readable medium for storing data on a non-volatile memory device. Although the invention has been described in language specific to computer structural features, methodological acts and by computer readable media, and implementations utilizing a semiconductor integrated circuit, it is to be understood that the invention defined in the appended claims is not necessarily limited to the specific structures, acts or media described. Therefore, the specific structural features, acts and mediums are disclosed as exemplary embodiments implementing the claimed invention.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A computer-implemented method for storing data on a non-volatile memory device configured for storing data bits thereon, the data bits being in either an erased state following an erase operation or an updated state following a write operation, which is an inverse of the erased state, the method comprising performing computer-implemented operations for:

receiving a request to update a variable stored at a current location in the non-volatile memory device as a plurality of data bits;

in response to the request, determining whether the variable is capable of being updated by only inverting a state of one or more data bits used to store the variable at the current location in the non-volatile memory device from the erased state to the updated state;

in response to determining that the variable is capable of being updated by only inverting the state of one or more data bits used to store the variable at the current location in the non-volatile memory device from the erased state to the updated state, updating the variable stored in the non-volatile memory device to the updated state by only inverting the state of one or more data bits used to store the variable at the current location in the non-volatile memory device from the erased state to the updated state; and in response to determining that the variable is not capable of being updated by only inverting the state of one or more data bits used to store the variable at the current location in the non-volatile memory device from the erased state to the updated state, then:

determining whether the variable is capable of being updated by only inverting a state of an invert flag associated with the variable, the invert flag comprising multiple bits such that when a state of a first bit of the multiple bits of the invert flag is inverted from an erased state to an updated state, then the associated variable is inverted when read from the memory device and when, after the state of the first bit is inverted from the erased state to the updated state, a state of a second bit of the multiple bits of the invert flag is inverted from an erased state to an updated state, then the associated variable is not inverted when read from the memory device, and in response to determining that the variable is capable of being updated by only inverting the state of the invert flag, only inverting the state of the invert flag to update the one or more data bits used to store the variable.

2. The method of claim 1, further comprising in response to determining that the variable is not capable of being updated by only inverting the state of the invert flag:

determining whether the variable is capable of being updated by only inverting the state of the invert flag and inverting the state of one or more data bits used to store the variable from the erased state to the updated state; and in response to determining that the variable is capable of being updated by only inverting the state of the invert flag and inverting the state of one or more data bits used to store the variable from an erased state to an updated state, only inverting the state of the invert flag and inverting the state of one or more data bits used to store the variable from the erased state to the updated state to update the variable.

3. The method of claim 2, further comprising in response to determining that the variable is not capable of being updated by only inverting the state of the invert flag and inverting the state of one or more data bits used to store the variable from the erased state to the updated state:

updating the variable by reading the variable from a current location of the non-volatile memory device, modifying the variable to an updated value, and storing the updated value of the variable in the non-volatile memory device at a new location different from the current location of the non-volatile memory device.

4. The method of claim 3, further comprising reading the variable from the memory device, determining whether the invert flag associated with the variable is set, and, in response to determining that the invert flag is set, inverting the state of the one or more data bits used to store the variable read from the non-volatile memory device.

5. A computer storage media for storing a variable on a non-volatile memory device having data bits stored in an erased state following an erase operation or an updated state following a write operation, the updated state being an inverse of the erased state, the computer storage media having computer-executable instructions stored thereon which, when executed by a computer, will cause the computer to:

store an initial value of the variable comprising a plurality of data bits at a current location in the non-volatile memory device in a manner so as to minimize the number of data bits used to store the variable that are in the updated state;

associate an invert flag with the variable which, when set, will cause the initial value of the variable read from the non-volatile memory device to be inverted;

receive a request to change the initial value of the variable to an updated value in the non-volatile memory device;

in response to receiving the request, determine whether the initial value of the variable is capable of being inverted to the updated value at the current location in the non-volatile memory device by only inverting the state of one or more data bits used to store the variable in the non-volatile memory device from the erased state to the updated state;

if the initial value of the variable is capable of being inverted to the updated value by only inverting the state of one or more data bits from the erased state to the updated state, invert the updated variable at the current location in the memory device by only inverting the state of one or more data bits from the erased state to the updated state; and if the initial value of the variable is not capable of being inverted to the updated value by only inverting the state of one or more data bits from the erased state to the updated state, then:

determine whether the variable is capable of being inverted to the updated value by only inverting a state of the invert flag associated with the variable, the invert flag comprising multiple bits such that when a state of a first bit of the multiple bits of the invert flag is inverted from an erased state to an updated state, then the associated variable is inverted when read from the memory device and when, after the state of the first bit is inverted from the erased state to the updated state, a state of a second bit of the multiple bits of the invert flag is inverted from an erased state to an updated state, then the associated variable is not inverted when read from the memory device, and in response to determining that the variable is capable of being updated by only inverting the state of the invert flag, only invert the state of the invert flag to update the one or more data bits used to store the variable.

6. The computer storage media of claim 5, having further computer-executable instructions stored thereon which, when executed by the computer, will cause the computer to read the updated value of the variable from the memory device, determine whether the invert flag associated with the variable is set, and, in response to determining that the invert flag is set, to invert the value of the variable read from the memory device.

7. A computer system capable of storing a variable in a non-volatile memory, the computer system comprising:

a processor;

a non-volatile random access memory (NVRAM) device for storing the variable, the NVRAM device storing data bits thereon in either an erased state following an erase operation or an updated state following a write operation, the updated state being an inverse of the erased state; and a computer program for executing on the processor, the computer program configured to:

receive a request to update a variable stored at a current location in the NVRAM device as a plurality of bits, determine in response to the request whether the variable is capable of being updated at the current location in the NVRAM device by only inverting the state of one or more data bits used to store the variable from the erased state to the updated state at the current location in the NVRAM device, update the variable at the current location in the NVRAM device by only inverting the state of one or more data bits used to store the variable from the erased state to the updated state in response to determining that the variable is capable of being updated by only inverting the state of one or more data bits used to store the variable from the erased state to the updated state, and in response to determining that the variable is not capable of being updated by only inverting the state of one or more data bits used to store the variable from the erased state to the updated state, then:

determine whether the variable is capable of being updated by only inverting a state of an invert flag associated with the variable, the invert flag comprising multiple bits such that when a state of a first bit of the multiple bits of the invert flag is inverted from an erased state to an updated state, then the associated variable is inverted when read from the NVRAM device and when, after the state of the first bit is inverted from the erased state to the updated state, a state of a second bit of the multiple bits of the invert flag is inverted from an erased state to an updated state, then the associated variable is not inverted when read from the NVRAM device, and only invert the state of the invert flag to update the one or more data bits used to store the variable in response to determining that the variable is capable of being updated by only inverting the state of the invert flag.

8. The computer system of claim 7, wherein the computer program is further configured to in response to determining that the variable is not capable of being updated by only inverting the invert flag:

determine whether the variable is capable of being updated by only inverting the state of the invert flag and inverting the state of one or more data bits used to store the variable from an erased state to an updated state; and in response to determining that the variable is capable of being updated by only inverting the state of the invert flag and inverting the state of one or more data bits used to store the variable from the erased state to the updated state, only invert the state of the invert flag and to only invert the state of one or more data bits used to store the variable from the erased state to the updated state to update the variable.

9. The computer system of claim 8, wherein the computer program is further configured in response to determining that the variable is not capable of being updated by only inverting the state of the invert flag and inverting the state of one or more data bits used to store the variable from the erased state to the updated state to:

update the variable by reading the variable from the NVRAM device, modify the variable to a new value, and store the new value in the non-volatile memory device at a location different from the current location in the non-volatile memory device.

\* \* \* \* \*